(12) United States Patent
Sahlin et al.

(10) Patent No.: US 8,490,343 B2
(45) Date of Patent: Jul. 23, 2013

(54) ATTACHMENT SYSTEM OF PHOTOVOLTAIC CELLS TO FLUOROPOLYMER STRUCTURAL MEMBRANE

(75) Inventors: Katherine M. Sahlin, Old Orchard Beach, ME (US); Marcel Dery, Westford, MA (US); Michael P. Cushman, Merrimack, NH (US)

(73) Assignee: Saint-Gobain Performance Plastics Corporation, Aurora, OH (US)

( * ) Notice: Subject to any disclaimer, the term of this patent is extended or adjusted under 35 U.S.C. 154(b) by 392 days.

(21) Appl. No.: 12/873,426

(22) Filed: Sep. 1, 2010

(65) Prior Publication Data

US 2011/0056559 A1 Mar. 10, 2011

Related U.S. Application Data

(60) Provisional application No. 61/240,843, filed on Sep. 9, 2009, provisional application No. 61/305,640, filed on Feb. 18, 2010.

(51) Int. Cl.
*H01L 31/042* (2006.01)

(52) U.S. Cl.
USPC .......................... 52/173.3; 136/259

(58) Field of Classification Search
USPC .......................... 136/259; 52/173.3
See application file for complete search history.

(56) References Cited

U.S. PATENT DOCUMENTS

| | | | |
|---|---|---|---|
| 3,030,290 A | 4/1962 | Ryan | |
| 3,255,099 A | 6/1966 | Wolinski | |
| 3,274,089 A | 9/1966 | Wolinski | |
| 3,274,090 A | 9/1966 | Edward | |
| 3,274,091 A | 9/1966 | Edward | |
| 3,275,540 A | 9/1966 | McBride | |
| 3,284,331 A | 11/1966 | McBride et al. | |
| 3,291,712 A | 12/1966 | McBride | |
| 3,296,011 A | 1/1967 | McBride et al. | |
| 3,391,314 A | 7/1968 | Carter | |
| 3,397,132 A | 8/1968 | Wolinksi | |
| 3,485,734 A | 12/1969 | Pecha | |
| 3,507,763 A | 4/1970 | McBride | |
| 3,676,181 A | 7/1972 | Kowalewski | |
| 4,549,921 A | 10/1985 | Wolfe | |
| 4,770,927 A | 9/1988 | Effenberger et al. | |
| 6,726,979 B2 | 4/2004 | Friedman et al. | |

FOREIGN PATENT DOCUMENTS

| | | |
|---|---|---|
| JP | 2001-047568 | 2/2001 |
| JP | 2003-347570 | 12/2003 |
| JP | 2004/055970 | 2/2004 |

OTHER PUBLICATIONS

Sina Ebnesajjad, "Non-melt Processible Fluoroplastics: The Definitive User's Guide and Databook", 2000, Plastics Design Library, Norwich, NY, pp. 175-178.
International Search Report PCT/US2010/047655 dated May 18, 2011 (3 pgs.).

*Primary Examiner* — Mark Wendell
(74) *Attorney, Agent, or Firm* — Scott D. Rothenberger; Fulbright & Jaworski, LLP

(57) ABSTRACT

The invention describes an extensible membrane system to which a photovoltaic device is secured.

20 Claims, 6 Drawing Sheets

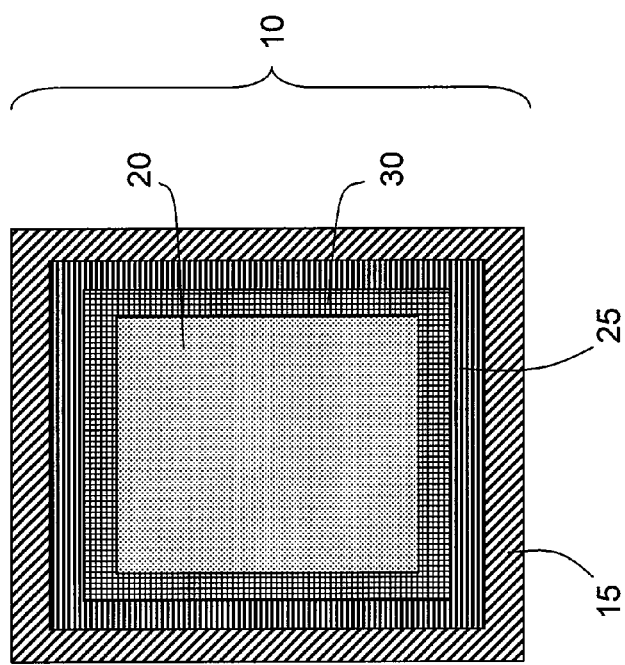
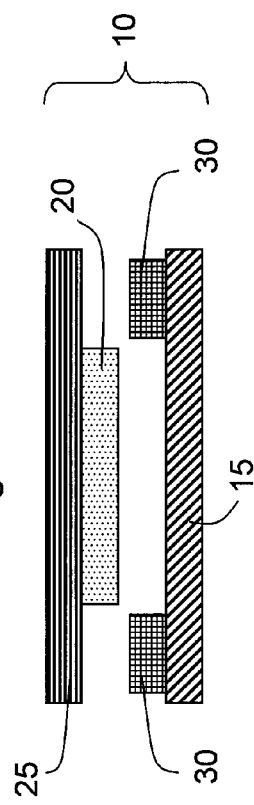

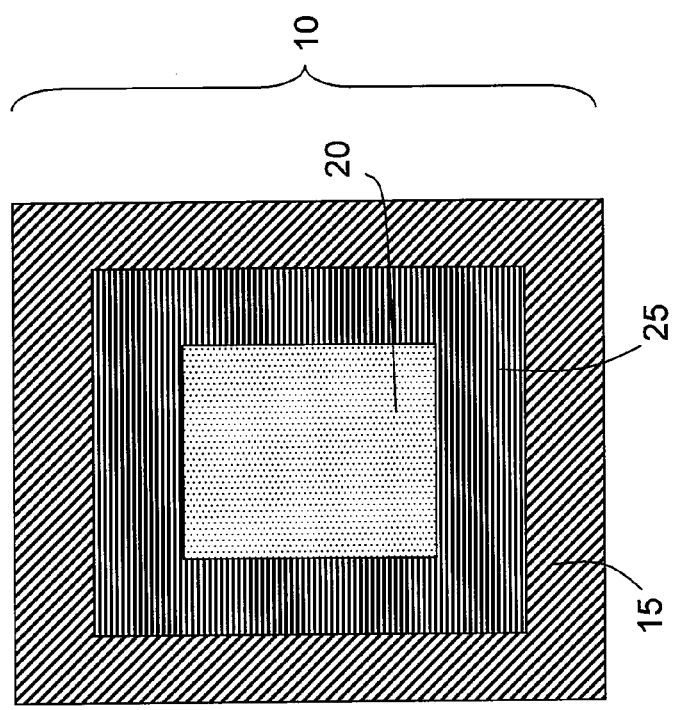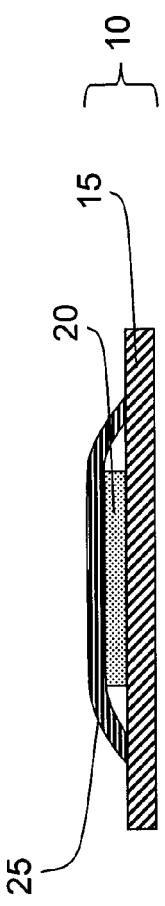
Figure 3
Figure 4

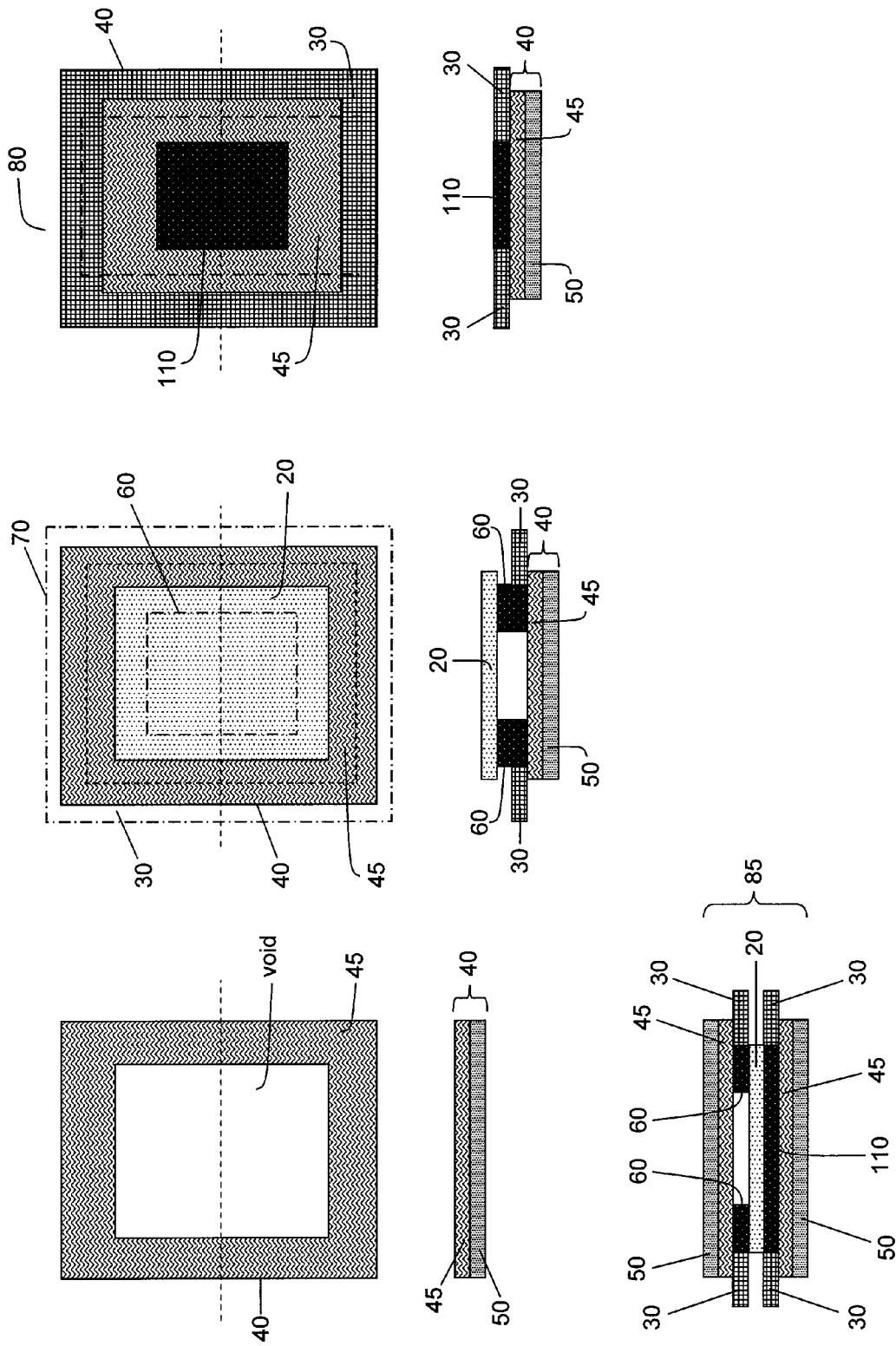

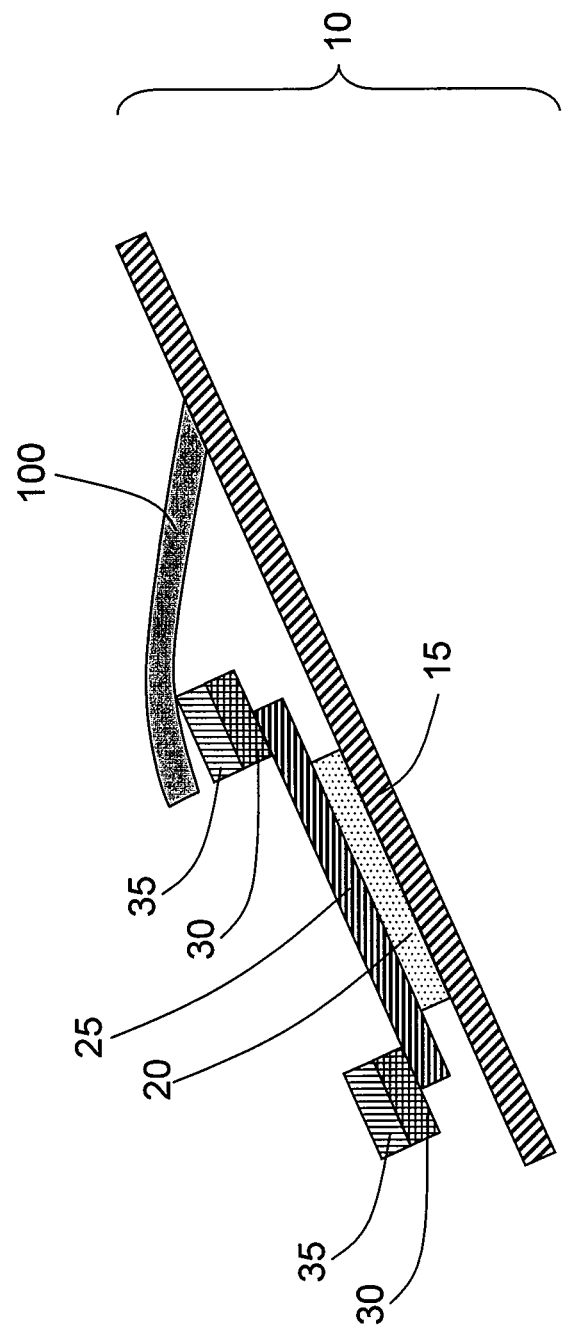

ATTACHMENT SYSTEM OF PHOTOVOLTAIC CELLS TO FLUOROPOLYMER STRUCTURAL MEMBRANE

CROSS REFERENCE TO RELATED APPLICATIONS

This application claims benefit under 35 U.S.C. §119(e) to U.S. Ser. No. 61/240,843, entitled "Attachment System of Photovoltaic Cells to Fluoropolymer Structural Membrane", filed Sep. 9, 2009 and U.S. Ser. No. 61/305,640, entitled "Attachment System of Photovoltaic Cells to Fluoropolymer Structural Membrane", filed Feb. 18, 2010, the contents of which are incorporated herein by reference in their entirety for all purposes.

FIELD OF THE INVENTION

The invention generally relates to an extensible architectural membrane system to which a photovoltaic device is secured. The device is covered by a fluoropolymer film protecting layer, such as ETFE and secured by an encasement about its perimeter via a bondable material to the fluoropolymer film and membrane or, alternatively, by sealing the fluoropolymer film directly to the membrane and securely encasing the photovoltaic device.

BACKGROUND OF THE INVENTION

Photovoltaic devices, also referred to as solar cells or solar modules, can be affixed to the rooftop of building structures. These devices convert light energy from the sun into electricity that may be used or stored for later use. Many buildings have roofs that may be desirable for solar cell or solar module placement.

Traditionally, installation of photovoltaic systems involves attaching the device to a roof with mechanical fasteners such as bolts or screws. While this can be effective to secure the devices, damage to the roof can occur during installation. For example, the holes may leak, the holes may be the source of other eventual failures such as tearing or cracking and/or the installation of screws or bolts can be time consuming and require precise measurement and drilling of fastener holes. Perhaps more importantly, mechanical fasteners are relatively permanent, and the photovoltaic devices may not be easily moved or removed without leaving damaged roof sections.

Such issues with securing the photovoltaic device to a roof is exacerbated where the roof is of "tensioned" or air supported type construction. Architectural membranes are used in tension or air supported type construction, where the membrane is stretched (placed under tension) across supporting members. Securing a photovoltaic device by screws or fasteners to such an architectural membrane would either lead to complete failure of the membrane by tearing, or at the very least, provide holes that would permit leakage.

Therefore, a need exists for ways to secure photovoltaic devices to architectural membranes that do not compromise the water resistant properties thereof and that are integrated into the roofing system.

BRIEF SUMMARY OF THE INVENTION

The present invention surprisingly provides a photovoltaic device/architectural membrane system that advantageously has extensible properties, such that the system has the ability to elongate/extend/shrink/deform without damage to the photovoltaic device. In one aspect, it can be understood that the underlying architectural membrane has physical attributes to conform to given atmospheric conditions (heat, cold, rain, snow, wind, etc.) whereas the photovoltaic device generally is less flexible. However, by the unique construction of the system, the architectural membrane can conform to the changes while the photovoltaic device remains relatively non-extensible. As a metaphor, it can be thought of similarly to earthquake resistant building in California, where the building is supported on a series of rollers/springs that absorb deformations due to an earthquake, while the remainder of the building does not need to conform. Similarly, the underlying architectural membrane system can adapt to applied stresses and weather related conditions, while the photovoltaic device is not required to do so.

The system includes a photovoltaic device/architectural membrane system comprising a fluoropolymer encapsulated reinforcement layer, a photovoltaic device in contact with the fluoropolymer encapsulated reinforcement layer, an fluoropolymer layer such as ethylene tetrafluoroethylene copolymer layer (ETFE) or FEP that covers and extends beyond the perimeter of the photovoltaic device (a cover layer) and a bondable layer between the fluoropolymer cover layer and the fluoropolymer encapsulated reinforcement. The bondable layer seals the photovoltaic device in between the cover layer and the fluoropolymer encapsulated reinforcement layer such that the device is secure but can move in various directions as the fluoropolymer encapsulated reinforcement layer extends and stretches.

The present invention also provides a photovoltaic device/architectural membrane system comprising a fluoropolymer encapsulated reinforcement layer, a photovoltaic device in contact with the fluoropolymer encapsulated reinforcement and a fluoropolymer cover layer such as an ethylene tetrafluoroethylene copolymer layer (ETFE) or FEP that covers and extends beyond the perimeter of the photovoltaic device. The perimeter portion of the fluoropolymer cover layer that extends beyond the dimensions of the photovoltaic device is bonded to the fluoropolymer encapsulated reinforcement. The fluoropolymer cover layer, such as an ETFE or FEP layer, thus seals the photovoltaic device in between the cover layer and the fluoropolymer encapsulated reinforcement layer such that the device is secure but can move in various directions as the fluoropolymer encapsulated reinforcement layer extends and stretches.

As noted above, by inclusion of the layers of the system described herein, the system itself is flexible enough to withstand physical changes due to wind, rain, snow, heat, cold, etc. The construction is unique where, for example, the fluoropolymer/reinforcement layer, the bondable layer, and/or an adhesive all provide extensibility for the ultimate construct.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed descriptions are to be regarded as illustrative in nature and not restrictive.

BRIEF DESCRIPTION OF THE DRAWINGS

FIG. 1 provides an embodiment of the invention.
FIG. 2 provide a side aspect of FIG. 1.
FIG. 3 provides another embodiment of the invention.
FIG. 4 provides a side aspect of FIG. 3.

FIG. 7 shows a frame system of the invention.

FIG. 8 provides a depiction where a protective flap helps prevent debris from effecting a photovoltaic device secured to a substrate by the embodiments of the invention.

DETAILED DESCRIPTION

Figure 5:
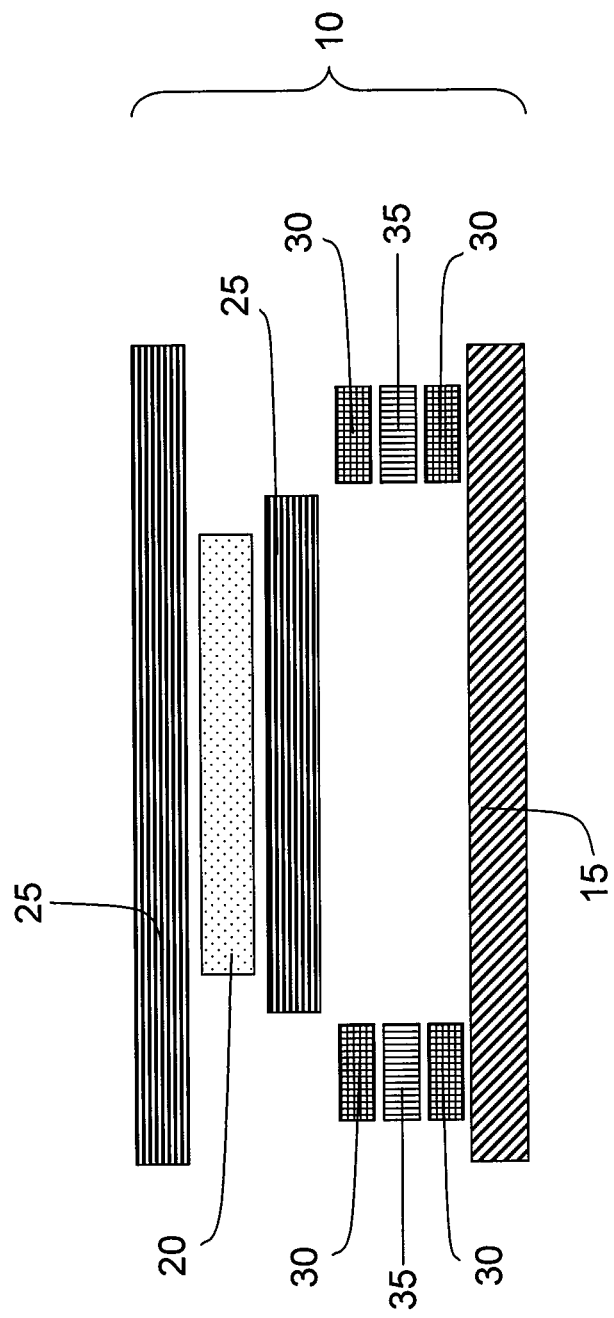
FIG. 5 is an alternative embodiment of the invention.

In the specification and in the claims, the terms "including" and "comprising" are open-ended terms and should be interpreted to mean "including, but not limited to . . . " These terms encompass the more restrictive terms "consisting essentially of" and "consisting of."

It must be noted that as used herein and in the appended claims, the singular forms "a", "an", and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

Unless defined otherwise, all technical and scientific terms used herein have the same meanings as commonly understood by one of ordinary skill in the art to which this invention belongs. All publications and patents specifically mentioned herein are incorporated by reference in their entirety for all purposes including describing and disclosing the chemicals, instruments, statistical analyses and methodologies which are reported in the publications which might be used in connection with the invention. All references cited in this specification are to be taken as indicative of the level of skill in the art. Nothing herein is to be construed as an admission that the invention is not entitled to antedate such disclosure by virtue of prior invention.

In one aspect, the present invention surprisingly provides a system to secure a photovoltaic device to a tensioned or air supported architectural membrane structure by use of either an "envelope" of a fluoropolymer cover layer (e.g., ETFE or FEP) that encompasses the photovoltaic device and is adhered to the membrane structure or by having a piece of a fluoropolymer cover layer extend beyond the perimeter of the photovoltaic device and then bonding the fluoropolymer cover layer to the membrane via a bondable layer.

One advantage of the system is the ability to remove and replace photovoltaic components from the system without the damage to the underlying support. Therefore, when a photovoltaic component is damaged, is worn out, requires maintenance, etc., the component can simply be removed and either replaced or repaired and reattached without the need to reattached by fasteners or screws as more traditional systems. It should be understood that another advantage is that the photovoltaic component is securely fastened to the system, such that it can withstand wind, rain, snow, heat, cold, etc. while still accommodating the flexing and elongation of the membrane. The "envelope" system provides the ability to change/replace the device while still providing a strong enough engagement that the elements do not cause the component to be easily separated from the system.

The phrase "photovoltaic device" include photovoltaic cells, solar cells or modules comprising crystalline silicon, a-silicon (amorphous silicon); CIGS (Copper Indium Gallium diSelenide or diSulfide); DSSC (Dye Sensitized Solar Cell); OPV (Organic Photovoltaic); CdTe (Cadmium Telluride) GdAs (Gallium Arsenide) or, for example, a Unisolar PVL-136 laminate and the like. The photovoltaic construction can be rigid such as crystalline silicon with a glass front surface or flexible, such as thin film amorphous silicon with an ETFE front surface.

The phrase "architectural membrane" is known in the art and is intended to include structural elements, more specifically to "fabric structures" also referred to herein as "architectural membrane structures", "architectural structures" or simply as "structures" or "composites", the last two terms being used interchangeably. Examples include tents, awnings, canopies, shaded parking structures, stadiums, amphitheaters, airports and the like.

In some aspects the structure is a tensioned or tensile structure which typically carries tension stress only, without compression or bending. In specific examples, the structure disclosed herein meets a proposed Industry Standard for carrying tension or shear only in the plane of the membrane.

The phrase "fluoropolymer" is known in the art and is intended to include, for example, polytetrafluoroethylene, copolymers of tetrafluoroethylene and hexafluoropropylene, tetrafluoroethylene-perfluoro(alkyl vinyl ether) copolymers (e.g., tetrafluoroethylene-perfluoro(propyl vinyl ether), FEP (fluorinated ethylene propylene copolymers), polyvinyl fluoride, polyvinylidene fluoride, and copolymers of vinyl fluoride, chlorotrifluoroethylene, and/or vinylidene difluoride (i.e., VDF) with one or more ethylenically unsaturated monomers such as alkenes (e.g., ethylene, propylene, butylene, and 1-octene), chloroalkenes (e.g., vinyl chloride and tetrachloroethylene), chlorofluoroalkenes (e.g., chlorotrifluoroethylene), fluoroalkenes (e.g., trifluoroethylene, tetrafluoroethylene (i.e., TFE), 1-hydropentafluoropropene, 2-hydropentafluoropropene, hexafluoropropylene (i.e. HFP), and vinyl fluoride), perfluoroalkoxyalkyl vinyl ethers (e.g., $CF_3OCF_2CF_2CF_2OCF=CF_2$); perfluoroalkyl vinyl ethers (e.g., $CF_3OCF=CF_2$ and $CF_3C_2CF_2OCF=CF_2$), and combinations thereof.

The fluoropolymer can be melt-processable, for example, as in the case of polyvinylidene fluoride; copolymers of vinylidene fluoride,; copolymers of tetrafluoroethylene, hexafluoropropylene, and vinylidene fluoride copolymers of tetrafluoroethylene and hexafluoropropylene; copolymers of ethylene and tetrafluoroethylene and other melt-processable fluoroplastics; or the fluoropolymer may not be melt-processable, for example, as in the case of polytetrafluoroethylene, copolymers of TFE and low levels of fluorinated vinyl ethers, and cured fluoroelastomers.

Useful fluoropolymers include copolymers of HFP, TFE, and VDF (i.e., THV). Examples of THV polymers include those marketed by Dyneon, LLC under the trade designations "DYNEON THV".

Other useful fluoropolymers also include copolymers of ethylene, TFE, and HFP. Such polymers are marketed, for example, under the trade designation "DYNEON FLUOROTHERMOPLASTIC HTE" by Dyneon, LLC.

Additional commercially available vinylidene fluoride-containing fluoropolymers include, for example, those fluoropolymers having the trade designations; "KYNAR" (e.g., "KYNAR 740") as marketed by Arkema, Philadelphia, Pa.; "HYLAR" (e.g., "HYLAR 700") and "SOLEF" as marketed by Solvay Solexis USA, West Deptford, N.J.; and "DYNEON PVDF Fluoroplastics" such as DYNEON FP 109/0001 as marketed by Dyneon, LLC;. Copolymers of vinylidene difluoride and hexafluoropropylene are also useful. These include for example KYNARFLEX (e.g. KYNARFLEX 2800 or KYNARFLEX 2550) as marketed by Arkema.

Commercially available vinyl fluoride fluoropolymers include, for example, those homopolymers of vinyl fluoride marketed under the trade designation "TEDLAR" by E.I. du Pont de Nemours & Company, Wilmington, Del.

Useful fluoropolymers also include copolymers of tetrafluoroethylene and propylene (TFE/P). Such polymers are commercially available, for example, under the trade designations "AFLAS as marketed by AGC Chemicals America, or "VITON" as marketed by E.I. du Pont de Nemours & Company, Wilmington, Del.

Useful fluoropolymers also include copolymers of ethylene and TFE (i.e., "ETFE"). Such polymers may be obtained commercially, for example, as marketed under the trade designations "DYNEON FLUOROTHERMOPLASTIC ET 6210A", "DYNEON FLUOROTHERMOPLASTIC ET 6235", or by Dyneon, LLC, or under the trade designation "NEOFLON ETFE" from Daikin America Inc (e.g. NEOFLON ETFE EP521, EP541, EP543, EP610 OR EP620), or under the trade designation "TEFZEL" from E.I. du Pont de Nemours & Company, Wilmington, Del.

Additionally, useful fluoropolymers include copolymers of ethylene and chlorotrifluoroethylene (ECTFE). Commercial examples include Halar 350 and Halar 500 resin from Solvay Solexis Corp.

Other useful fluoropolymers include substantially homopolymers of chlorotrifluoroethylene (PCTFE) such as Aclar from Honeywell.

Modified fluoropolymers, a subgroup of fluoropolymers in general, are also useful. Suitable functional groups attached in modified (functionalized) fluoropolymers are carboxylic acid groups such as maleic or succinic anhydride (hydrolyzed to carboxylic acid groups), carbonates, epoxy, acrylate and its derivative such as methacrylate, phosphoric acid and sulfonic acid. Commercially available modified fluoropolymers include Fluon® LM-ETFE AH from Asahi, Neoflon® EFEP RP5000 and Neoflon® ETFE EP7000 from Daikin and Tefzel®HT2202 from DuPont.

Fluoropolymeric substrates may be provided in any form (e.g., film, tape, sheet, web, beads, particles, or as a molded or shaped article) as long as fluoropolymer can be processed.

Fluoropolymers are generally selected as outer layers to provide chemical resistance, electrical insulation, weatherability and/or a barrier to moisture.

The term "encapsulated" is intended to mean that the reinforcement material is covered with a fluoropolymer. The coating does not necessarily need to be uniform in coverage or thickness but generally coats the fibers or the reinforcement. The encapsulating material can be dipped, sprayed, painted, vapor deposited, laminated etc. onto the reinforcement. Additionally, the encapsulant, e.g., the fluoropolymer, can be sintered at elevated temperatures.

For example, an encapsulated reinforcement construct can be formed by coating or impregnating a reinforcement substrate, e.g. fiberglass, with PTFE or the like in known manner, for example, by applying the PTFE from a suspension and fusing the applied PTFE, for example in accordance with the teachings of U.S. Pat. No. 3,928,703 to Cook.

Encapsulated reinforcement constructs are known in the art and can be prepared by the methods described in Non-melt Processible Fluoroplastics: The Definitive User's Guide and Databook, Sina Ebnesajjad, 2000, Plastics Design Library, Norwich, N.Y., the contents of which are incorporated herein by reference. See for example, page 175 through 178. Briefly, a fiberglass fabric is passed through a fluoropolymer dispersion. Excess material is removed from the fabric and the materials are dried. This process can be repeated multiple times and then the composite can be subjected to baking, calendering and/or sintering.

For example, a woven fiberglass fabric can be heat-cleaned to minimize residual sizing. A coating can be applied by dipping the substrate in an aqueous dispersion of PTFE (TE3879 obtained from Dupont and applied at 53% solids). The coating is then dried and sintered in a single or multi-zone coating tower with drying temperatures of 350° F. and sintering zone temperatures 680° F.

The construct can be finished with a bondable layer topcoat using, for example, an FEP dispersion (TE-9568 obtained from DuPont and applied at 38% solids). The topcoat can be applied by dipping, drying and sintering in a single or multi-zone tower. The drying temperature is about 350° F., and the sintering temperature is about 680° F.

If desired, one or a mixture of additives may be included in the encapsulating solution/dispersion for producing a desired effect. For example, a colorant or dye, UV stabilizer, or a mixture of fungicides, bactericides, mildewicides or other biocidal agents may be incorporated into the material so as to result in a film having visual effects or enhanced resistant to environmental effects.

Suitable examples of encapsulated reinforcement constructs include architectural membranes. Encapsulated reinforcements include those prepared from fiberglass substrates encapsulated with PTFE which is subsequently sintered. Examples include SHEERFILL® products by Saint-Gobain Performance Plastics Corporation (Merrimack, N.H.), such as SHEERFILL® IIA, I-HT, II-HT, IVA or V, DURASKIN (Verseidag, Germany), SKYTOP (Chukoh, Japan) or SOLUS (Taconic, South Korea).

The term "reinforcement" is recognized in the art and is intended to include materials that are fabrics, wovens, nonwovens, lay downs, meshes and the like. Suitable reinforcement materials include, for example, glass, fiberglass, aramids, polyesters, polyamides, carbon fibers, metal fibers, halopolymers and the like.

Any suitable textile material capable of withstanding processing temperatures and able to sustain the static and dynamic mechanical loads in a structure may be employed as the reinforcing material in accordance with the present invention. Examples include, inter alia, fiberglass, ceramics, graphite (carbon), PBI (polybenzimidazol), polyaramides such as KEVLAR and NOMEX, polyesters such as REEMAY, polyamides, polyimides, thermoplastics such as TEFZEL (ETFE), polyethersulfones, polyetherimides, polyetherketones, novoloid phenolic fibers such as KYNOL, PTFE, cotton, and other natural and synthetic fibers. The reinforcing material may comprise a yarn filament, monofilament, slit film or the like assembled as a textile. The reinforcing material also may comprise a metallic material such as steel wire or mesh or the like. In one aspect, the reinforcing material comprises fiberglass In particular, materials that can withstand processing temperatures of at least 360° C. are desirable.

The term "contact" means that the photovoltaic device can be in direct contact with a material or indirect contact, such as where an encapsulant surrounds a portion or all of the photovoltaic. Contact should also be understood as encompassing the situations where the photovoltaic device can move and reposition as stresses to the fluoropolymer encapsulated reinforcement layer cause the layer to deform (e.g., wind, snow, rain). Therefore, the contact between the photovoltaic and surrounding layers is such that the construct is not so rigid as to cause the photovoltaic device to break due to exterior stresses to one of more of the surrounding layers. Additionally, the photovoltaic device can "move" with the architectural system as the system itself moves when exerted upon.

The phrase "bondable layer" is intended to encompass two types of materials. In one aspect, the bondable layer is a layer that has similar characteristics to the fluoropolymer material but is adapted to provide adhesive characteristics for the adhesion to another material, such as another fluoropolymer.

Suitable bondable materials include, for example, PFA, PVDF, ETFE, THV or FEP. The bondable layer can further include one or more reinforcement materials to help strengthen the construct.

In another aspect, the bondable layer, the fluoropolymer of the fluoropolymer encapsulated reinforcement or both can be surface treated. Generally, hydrophilic functionalities are attached to the fluoropolymer surface, rendering it easier to wet and provides opportunities for chemical bonding. There are several methods to functionalize a fluoropolymer surface including plasma etch, corona treatment, chemical vapor deposition, or any combination thereof. In another embodiment, plasma etching includes reactive plasmas such as hydrogen, oxygen, acetylene, methane, and mixtures thereof with nitrogen, argon, and helium. Corona treatment can be conducted in the presence of reactive hydrocarbon vapors such as ketones, e.g., acetone, C1-C4 carbon chain length alcohols, p-chlorostyrene, acrylonitrile, propylene diamine, anhydrous ammonia, styrene sulfonic acid, carbon tetrachloride, tetraethylene pentamine, cyclohexyl amine, tetra isopropyl titanate, decyl amine, tetrahydrofuran, diethylene triamine, tertiary butyl amine, ethylene diamine, toluene-2,4-diisocyanate, glycidyl methacrylate, triethylene tetramine, hexane, triethyl amine, methyl alcohol, vinyl acetate, methylisopropyl amine, vinyl butyl ether, methyl methacrylate, 2-vinyl pyrrolidone, methylvinylketone, xylene or mixtures thereof.

Some techniques use a combination of steps including one of these methods. For example, surface activation can be accomplished by plasma or corona in the presence of an excited gas species.

Not to be limited by theory, the method has been found to provide strong interlayer adhesion between a modified fluoropolymer and a non fluoropolymer interface (or a second modified fluoropolymer). In one way, a fluoropolymer and a non fluoropolymer shape are each formed separately. Subsequently, the fluoropolymer shape is surface treated by the treatment process described in U.S. Pat. Nos. 3,030,290; 3,255,099; 3,274,089; 3,274,090; 3,274,091; 3,275,540; 3,284,331; 3,291,712; 3,296,011; 3,391,314; 3,397,132; 3,485,734; 3,507,763; 3,676,181; 4,549,921; and 6,726,979, the teachings of which are incorporated herein in their entirety for all purposes. Then, the resultant modified fluoropolymer and non fluoropolymer shapes are contacted together for example by heat lamination to form a multilayer film. Additionally, the multilayer film can be submitted to a UV radiation with wavelengths in the UVA; UVB and/or UVC range.

In one aspect, the surface of the fluoropolymer substrate is treated with a corona discharge where the electrode area was flooded with acetone, a C1-C4 carbon chain length alcohol, tetrahydrofuran methyl ethyl ketone, ethyl acetate, isopropyl acetate or propyl acetate vapors.

Corona discharge is produced by capacitative exchange of a gaseous medium which is present between two spaced electrodes, at least one of which is insulated from the gaseous medium by a dielectric barrier. Corona discharge is somewhat limited in origin to alternating currents because of its capacitative nature. It is a high voltage, low current phenomenon with voltages being typically measured in kilovolts and currents being typically measured in milliamperes. Corona discharges may be maintained over wide ranges of pressure and frequency. Pressures of from 0.2 to 10 atmospheres generally define the limits of corona discharge operation and atmospheric pressures generally are desirable. Frequencies ranging from 20 Hz to 100 kHz can conveniently be used: in particular ranges are from 500 Hz, especially 3000 Hz to 10 kHz.

All details concerning the corona discharge treatment procedure are provided in a series of U.S. Patents assigned to E. I. du Pont de Nemours and Company, USA, described in expired U.S. Pat. No. 3,676,181, and Saint-Gobain Performance Plastics Corporation U.S. Pat. No. 6,726,979, the teachings of which are incorporated herein in their entirety for all purposes. An example of the proposed technique may be found in U.S. Pat. No. 3,676,181 (Kowalski).

In another aspect, the surface of the fluoropolymer is treated with a plasma. The phrase "plasma enhanced chemical vapor deposition" (PECVD) is known in the art and refers to a process that deposits thin films from a gas state (vapor) to a solid state on a substrate. There are some chemical reactions involved in the process, which occur after creation of a plasma of the reacting gases. The plasma is generally created by RF (AC) frequency or DC discharge between two electrodes where in between the substrate is placed and the space is filled with the reacting gases. A plasma is any gas in which a significant percentage of the atoms or molecules are ionized, resulting in reactive ions, electrons, radicals and UV radiation.

The term "unencapsulated" is intended to mean a portion or surface of reinforcement that is not coated, treated, or otherwise in contact with a fluoropolymer, e.g., the surface is unmodified or virgin.

Therefore, in one aspect, the photovoltaic/architectural membrane construct can be "sided"; that is, one side of the reinforcement includes a fluoropolymer and the other side of the reinforcement does not include a fluoropolymer and is unencapsulated. This unmodified surface can then be further treated. Suitable examples of one "sided" reinforcements include microwave transmissive composite materials.

For example, the application of the fluoropolymer dispersion can be carefully controlled and localized at the surface of the reinforcement, with penetration being adequate to achieve the desired bond. One method to achieve this is by kiss roll coating in which a roll transfers coating to the fabric by touching or "licking" the surface to apply coating to only one side of the fabric. Another method is a combination of kiss coating followed by pour coating. The kiss coating limits coating application to one side and pour coating can then be used to build up additional coating thickness.

Penetration depths of the dispersion should be controlled so that no obvious liquid penetration, or "bleed through" occurs to the other side. There should be no visible resin on the uncoated side of the fabric. Penetration depth should not generally exceed 50% of the overall reinforcement thickness.

The elimination of bleed through of the fluoropolymer dispersion is dependent on a number of factors, including the density of the reinforcement, the viscosity of the dispersion, the specific gravity of the dispersion, the coating method and its corresponding parameters such as coating time, etc.

A fluoropolymer dispersion can be chosen based on the characteristics required to produce the desired product. The specific dispersion selected has sufficient penetration to create an adequate bond between the reinforcement and its associated component. Dispersions having a wide range of viscosities can be utilized dependent on the thickness and porosity of the reinforcement, the desired weight of the finished product, the stiffness of the finished product, etc.

The specific gravity of the fluoropolymer dispersion also affects the coating properties. The specific gravity of the dispersion should be in the range of between 1.05 and 1.5, more particularly at least 1.35. Coating weights should be about 0.5 oz/sq yd and less than about 50 oz/sq yd.

Fluoropolymers useful in the present invention can be selected from those known to those skilled in the art, as described for example in U. S. Pat. No. 4,770,927 (Effenberger et al.), the disclosure of which is herein incorporated by reference in its entirely.

Commercially available fluoropolymer products useful with the present invention include the following perfluoroplastics:

PTFE: such as Daikin Polyflon; Dupont Teflon; ICI Fluon; Ausimont Algoflon;

FEP: such as Daikin Neoflon; Dupont Teflon;

PFA: such as Daikin Neoflon; Dupont Teflon; Ausimont Hyflon;

MFA: such as Ausimont Hyflon;

Fluoroelastomers: such as Dupont Viton; 3M Fluorel; Ausimont Tecnoflon; Daikin Daiel; Asahi Glass Aflas; and/or Perfluoroelastomers: such as Dupont Kalrez; DaikinPerfluor.

The fluoropolymers can also include fillers, pigments and other additives, examples of which include titanium dioxide, talc, graphite, carbon black, cadmium pigments, glass, metal powders and flakes, and other high temperature materials such as sand, fly ash, etc.

The reinforcement layers can be coated by the fluoropolymer by various techniques employing vertical coating towers, spray coaters, reverse roll coaters, roller coaters, horizontal coaters with doctor blades, kiss roll coating or other methods known in the art.

The construct can be finished with a bondable layer topcoat using, for example, an FEP dispersion (TE-9568 obtained from DuPont and applied at 38% solids). The topcoat can be applied by dipping, drying and sintering in a single or multizone tower. The drying temperature is about 350° F., and the sintering temperature is about 680° F.

If desired, one or a mixture of additives may be included in the encapsulating solution/dispersion for producing a desired effect. For example, a colorant or dye, UV stabilizer, or a mixture of fungicides, bactericides, mildewicides or other biocidal agents may be incorporated into the material so as to result in a film having enhanced resistant to environmental effects.

Examples of the "sided" layers include those manufactured by Saint-Gobain Performance Plastics Corporation (Merrimack, N.H.) such as RAYDEL® materials, e.g., M15-OS and M26-OS which are fiberglass single side coated with PTFE.

Referring now to FIGS. 1 and 2, the photovoltaic device/architectural system 10 includes a substrate fluoropolymer encapsulated reinforcement layer 15 which is in contact with a photovoltaic device 20 which is covered by an fluoropolymer cover layer, e.g., ETFE or FEP layer 25. Cover layer 25 is bonded to fluoropolymer encapsulated reinforcement layer 15 by bonding layer 30. Suitable materials for bonding layer 30 include, for example, heat bondable fluoropolymers such as a PFA, PVDF, THV, ETFE or an FEP.

The photovoltaic device, 20, can be any suitable photovoltaic cell, solar cell, crystalline silicon, amorphous silicon, CIGS, CIS, CdTe, DSSC, OPV or, for example, a Unisolar PVL-136 laminate and the like. The photovoltaic construction can be rigid such as crystalline silicon with a glass front surface or flexible, such as thin film amorphous silicon with, for example, an ETFE front surface.

Layers 15, 25 and 30 are as discussed herein and should not be limited. In one embodiment, bonding layer 30 has been surface treated (e.g., corona or plasma treated) to facilitate with adhesion between the fluoropolymer layer 15 and fluoropolymer cover layer 25.

In one aspect the layers are heat bonded to each other.

Combinations of various bonding/adhesion methods described herein are contemplated and included as part of the present invention.

The term "adhesive" is known in the art and includes various materials that can adhere two surfaces to each other. Suitable adhesives include, for example, a neoprene rubber, butyl rubber (e.g., Heliobond PVA 600BT), a two part epoxy, silicone caulks or a polyurethane adhesive.

It should be understood that each "layer" can be a strip, a circular attachment, a square attachment, oblong etc. etc. The layer does not need to be continuous or unitary in nature but sufficient to provide enough contact surface to the adjacent layer to accomplish the purpose of the layer.

FIG. 2 depicts the system 10 in an aspect prior to bonding fluoropolymer cover layer 25 to bonding layer 30 which is disposed onto fluoropolymer encapsulated reinforcement layer 15.

FIGS. 3 and 4 provide an alternative embodiment to the photovoltaic device/architectural system 10 of the present invention. A photovoltaic device 20 is secured between fluoropolymer cover layer 25 (e.g., ETFE or FEP) and fluoropolymer encapsulated reinforcement layer 15. In one aspect the fluoropolymer cover layer 25 has been surface treated (e.g., a corona process or plasma) as described herein. In another aspect fluoropolymer encapsulated reinforcement layer 15 can also be treated with a surface treatment as described herein.

In one embodiment, fluoropolymer cover layer 25 and fluoropolymer encapsulated reinforcement layer 15 are heat bonded to each other, securing photovoltaic device 20 there between.

FIG. 5 depicts an alternative embodiment in an aspect prior to assembly and sealing of layers. A first fluoropolymer cover layer 25 (e.g., ETFE or FEP) can be placed over top of photovoltaic device 20, and optionally, a second fluoropolymer layer 25 can also be placed below photovoltaic device 20. Bondable layers 30 (e.g., ETFE or FEP) can be placed on a first side of a fluoropolymer encapsulated reinforcement spacer layer 35. Alternatively, spacer layer can be a fluoropolymer film.

The spacer layer 35 can be of suitable construction to provide a frame about photovoltaic device 20 and is not necessarily limited to the material of fluoropolymer encapsulated reinforcement layer 15. Layers 30, 35, and 30 are placed onto fluoropolymer encapsulated reinforcement layer 15. First layer 25, 30, 35, 30 and 15 can be sealed, in particular via heat sealing. In one aspect, one or more of layers 15, 25, 30 and/or 35 have been surface treated (e.g., with a corona or plasma process) as described herein.

In one aspect, a 5 mil thick photovoltaic device 20 can be encapsulated on both sides by 26 mil EVA. On the top side of the construct, a 3 mil corona treated fluoropolymer cover layer 25 would be placed, such as a corona treated ETFE or FEP. A "frame" of a spacer layer 35 can be heat sealed via a 5 mil layer of bondable layer 30 (such as surface treated FEP or ETFE) to fluoropolymer encapsulated reinforcement layer 15 (such as SHEERFILL). Another layer of bondable layer 30, approximately 5 mil, can be placed on top of the attached "frame" and then the construct of cover layer 25, EVA layers and photovoltaic 20 can be heat sealed to the frame.

Film thicknesses are set forth herein in terms of "mils", wherein one mil is equal to 0.001 inch.

All layers of the system can be fully assembled prior to on site installation of the architectural membrane. This is generally possible if the expected elongation of the membrane during its positioning or installation will be less than about 3%. More commonly architectural membranes experience significantly greater than 3% elongation during installation. Therefore, one embodiment of the invention is to have the top half of the construction the fluoropolymer cover layer 25 and photovoltaic device 20 preassembled and the lower half of the construction (fluoropolymer encapsulated reinforcement layer 15 and, optionally, bondable layer 30) preassembled. The photovoltaic device containing half is then joined to the membrane after the structure is fully tensioned in place. The lower half can be appropriately sized and placed to adjust for dimensional changes that may occur during installation while still providing for final anchoring of the upper half containing the photovoltaic device.

In another aspect, two sides of the fluoropolymer cover layer 25 can be attached to fluoropolymer encapsulated reinforcement layer 15 prior to installation. The remaining sides of cover layer 25 can then be attached (to layer 15) after the fluoropolymer encapsulated reinforcement layer 15 is fully tensioned.

Alternatively, the system 10 can be installed on site. For example, referring to FIG. 1, the architectural membrane 15 (optionally with bonding layer 30) can be on an existing structure or can be new construction. The fluoropolymer cover layer 25 can then be heat bonded, for example, to the architectural membrane 15 on site after the membrane has been positioned/tensioned as desired. Bonding layer 30 can be applied on site or can be preapplied to 15 or 25 for convenience. The construct can then be added with or without the photovoltaic device 20. Thus the present invention provides the advantage that the components of the system can be packaged in a manner that is useful for the construction project.

Figure 6:
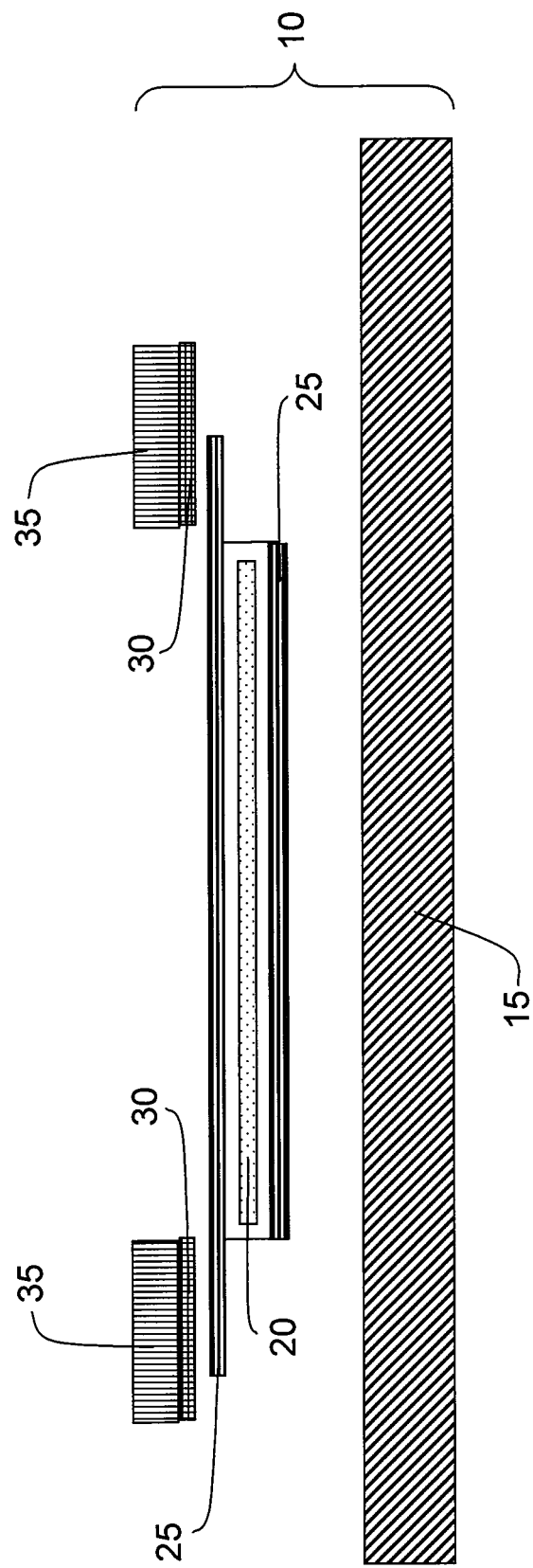
FIG. 6 is another alternative embodiment of the invention.

In another embodiment depicted in FIG. 6, photovoltaic device 20 can be encapsulated on both sides by EVA. A 3 mil surface treated fluoropolymer cover layer 25 would be placed over photovoltaic device 20 such that 25 would extend beyond the perimeter of 20. Suitable materials include corona treated ETFE or FEP. Optionally, another cover layer 25 could be placed under photovoltaic device.

A "frame" of a spacer layer 35 can be heat sealed via a 5 mil layer of bondable layer 30 (such as corona treated FEP or ETFE) to fluoropolymer encapsulated reinforcement layer 15 (such as SHEERFILL). The "frame" is attached to layer 25 that extends beyond the perimeter of photovoltaic device 20 via heat sealing, for example, between layers 30, 25 and 15. In particular, the frame further extends beyond the perimeter of layer 25 such that layer 30 can be directly bonded to the surface of fluoropolymer layer encapsulated reinforcement layer 15.

Additionally, in an alternative embodiment, spacer layer 35 can be a fluoropolymer film and not necessarily a reinforced encapsulated fluoropolymer composite.

It should be understood that the "frame" about the perimeter of photovoltaic device 20 can be unitary or formed of individual segments, such as strips, circles, squares or rectangles, etc. Additionally, the frame does not need to completely enclose photovoltaic device. For example, it can be three sided.

FIG. 7 provides another embodiment of the invention. A frame 70 is prepared from a first unencapsulated reinforcement layer 40, having a fluoropolymer side 50 and an unencapsulated reinforcement material side 45. An adhesive layer 60, such as a silicone caulk, is applied about the inner perimeter of frame 70, a flexible photovoltaic device 20 is placed on adhesive layer 60 and pressed to secure photovoltaic device 20 to layer 40. A bonding layer 30 (FEP, etc.) can be tacked onto the perimeter of 45 that was not treated with adhesive layer 60.

A second piece of unencapsulated reinforcement layer 40 is treated with a layer 110 (a liquid silicone resin) about the center portion of layer 40 on the unencapsulated reinforcement side 45. Bonding layer 30 (FEP, etc.) can be tacked onto the perimeter of 45 that was not treated with layer 110. The adhesive can be cured at an elevated temperature. This construct can be referred to as backing layer 80.

Frame 70 and backing layer 80 are brought together and sealed via bonding layers 30 to form pouch 85. These steps can be performed in a factory, prior to installation on site.

Pouch 85 can be brought to a site for installation and heat sealed to a fluoropolymer layer, such as a fluoropolymer encapsulated reinforcement layer 15. Bonding layer(s) 30 can further provide adhesion of pouch 85 to the surface of 15. An additional bonding layer, not shown, can be added between surface 15 and fluoropolymer side 50 to provide additional adhesion.

As shown in FIG. 8, device/architectural membrane systems 10, as described herein, adhered to encapsulated reinforcement construct 15 by the methods described herein, can further optionally include "flap" 100. Flap 100 helps protect photovoltaic device 20 from water, snow, ice, debris, etc. Flap 100 provides a low profile, allowing snow and ice to easily pass over the PV edge without damage to the device.

One additional advantage of the various embodiments presented herein, is that if for any reason the system is no longer desired, the various layers and photovoltaic device 20 can be removed, thus leaving only the architectural membrane 15.

It should be understood that release layers can be used to protect, for example, the bonding or adhesive layers of the architectural systems described herein so that assembly can be effected on site or assembled prior to installation on site, in full or in part.

The following paragraphs enumerated consecutively from one (1) through fifty eight (58) provide for various aspects of the present invention. In one embodiment, in a first paragraph (1), the present invention provides a 1. A photovoltaic device/architectural membrane system comprising a fluoropolymer encapsulated reinforcement layer, a photovoltaic device in contact with the fluoropolymer encapsulated reinforcement, a fluoropolymer cover layer that is heat sealable that covers and extends beyond the perimeter of the photovoltaic device and, optionally, a bondable layer between the fluoropolymer cover layer and the fluoropolymer encapsulated reinforcement.

2. The photovoltaic device/architectural membrane system of clam 1, wherein the fluoropolymer of the fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

3. The photovoltaic device/architectural membrane system of either of paragraphs 1 or 2, wherein the reinforcement comprises a glass, polyaramid, polyester, carbon fiber or metal fiber fabric, mesh, or nonwoven material.

4. The photovoltaic device/architectural membrane system of any of paragraphs 1 through 3, wherein the fluoropolymer cover layer is an ethylene tetrafluoroethylene copolymer layer (ETFE) or a fluorinated ethylene propylene copolymer (FEP).

The photovoltaic device/architectural membrane system of any of paragraphs 1 through 4, wherein the bondable layer is a PFA, PVDF, THV, ETFE or an FEP.

6. The photovoltaic device/architectural membrane system of any of paragraphs 1 through 5, wherein either the bondable layer is surface treated.

7. The photovoltaic device/architectural membrane system of any of paragraphs 1 through 6, further including an encapsulant disposed about the photovoltaic device.

8. The photovoltaic device/architectural membrane system of paragraph 7, wherein the encapsulant is an olefinic polymer or copolymer.

9. The photovoltaic device/architectural membrane system of any of paragraphs 1 through 8, further including a back sheet attached to the photovoltaic device.

10. The photovoltaic device/architectural membrane system of any of paragraphs 1 through 8, wherein the layers are heat sealed.

11. A photovoltaic device/architectural membrane system comprising a fluoropolymer encapsulated reinforcement layer, a photovoltaic device in contact with the fluoropolymer encapsulated reinforcement, a fluoropolymer cover layer that is heat sealable, that holds the photovoltaic device and extends beyond the perimeter of the photovoltaic device and is bonded to the fluoropolymer encapsulated reinforcement.

12. The photovoltaic device/architectural membrane system of claim 11, wherein the fluoropolymer of the fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

13. The photovoltaic device/architectural membrane system of either of paragraphs 11 or 12, wherein the reinforcement comprises a glass, polyaramid, polyester, carbon fiber or metal fiber fabric, mesh, or nonwoven material.

14. The photovoltaic device/architectural membrane system of any of paragraphs 11 through 13, wherein the fluoropolymer cover layer is an ethylene tetrafluoroethylene copolymer layer (ETFE) or a fluorinated ethylene propylene copolymer (FEP).

15. The photovoltaic device/architectural membrane system of any of paragraphs 11 through 14, wherein the fluoropolymer cover layer is surface treated.

16. The photovoltaic device/architectural membrane system of any of paragraphs 11 through 15, further including an encapsulant disposed about the photovoltaic device.

17. The photovoltaic device/architectural membrane system of paragraph 16, wherein the encapsulant is an olefinic polymer or copolymer.

18. The photovoltaic device/architectural membrane system of any of paragraphs 11 through 17, further including a back sheet attached to the photovoltaic device.

19. The photovoltaic device/architectural membrane system of any of paragraphs 11 through 18, wherein the layers are heat sealed.

20. A photovoltaic device/architectural membrane system comprising a fluoropolymer encapsulated reinforcement layer, a photovoltaic device in contact with the fluoropolymer encapsulated reinforcement, a fluoropolymer cover layer that is heat sealable that covers and extends beyond the perimeter of the photovoltaic device and is disposed onto a second bonding layer, a first bonding layer disposed upon the fluoropolymer encapsulated layer, a spacer layer disposed upon the first bonding layer and the second bonding layer disposed upon the separating layer, whereby the first bonding layer, separating layer and second bonding layer are provided about the perimeter of the photovoltaic device.

21. The photovoltaic device/architectural membrane system of claim 20, wherein the fluoropolymer of the fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

22. The photovoltaic device/architectural membrane system of either of paragraphs 20 or 21, wherein the reinforcement comprises a glass, polyaramid, polyester, carbon fiber or metal fiber fabric, mesh, or nonwoven material.

23. The photovoltaic device/architectural membrane system of any of paragraphs 20 through 22, wherein the fluoropolymer cover layer is an ethylene tetrafluoroethylene copolymer layer (ETFE) or a fluorinated ethylene propylene copolymer (FEP).

24. The photovoltaic device/architectural membrane system of any of paragraphs 20 through 23, wherein the fluoropolymer cover layer is surface treated.

25. The photovoltaic device/architectural membrane system of any of paragraphs 20 through 24, further including an encapsulant disposed about the photovoltaic device.

26. The photovoltaic device/architectural membrane system of paragraph 25, wherein the encapsulant is an olefinic polymer or copolymer thereof.

27. The photovoltaic device/architectural membrane system of any of paragraphs 20 through 26, further including a back sheet attached to the photovoltaic device.

28. The photovoltaic device/architectural membrane system of any of paragraphs 20 through 27, wherein the first bondable layer is either an FEP or an ETFE layer.

29. The photovoltaic device/architectural membrane system of any of paragraphs 20 through 28, wherein the spacer layer is a fluoropolymer encapsulated reinforcement material.

30 The photovoltaic device/architectural membrane system of any of paragraphs 20 through 29, wherein the second bondable layer is either an FEP or an ETFE layer.

31. The photovoltaic device/architectural membrane system of any of paragraphs 20 through 30, wherein any of the first bondable layer, the second bondable layer, the spacer layer, the fluoropolymer encapsulated reinforcement layer, the cover layer or all of these layers are surface treated.

32. The photovoltaic device/architectural membrane system of any of paragraphs 20 through 31, wherein the layers are heat sealed.

33. A photovoltaic device/architectural membrane system comprising:
a first fluoropolymer encapsulated reinforcement layer;
a photovoltaic device, wherein a bottom surface of the photovoltaic device is located adjacent to the fluoropolymer encapsulated reinforcement;
a fluoropolymer cover layer that is heat sealable that extends beyond the perimeter of the top surface of the photovoltaic device; and
a bondable layer disposed upon the fluoropolymer cover layer covering at least about the perimeter portion of the fluoropolymer cover layer; and
a fluoropolymer layer or a second fluoropolymer encapsulated reinforcement layer that covers at least the perimeter portion of the bondable layer.

34. The photovoltaic device/architectural membrane system of paragraph 33, further comprising a heat sealable layer that covers a least a portion of the bottom of the photovoltaic device.

35. The photovoltaic device/architectural membrane system of either of paragraphs 33 or 34, wherein the fluoropolymer of the fluoropolymer layer or first or second fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

36. The photovoltaic device/architectural membrane system of any of paragraphs 33 through 35, wherein the reinforcement comprises a glass, polyaramid, polyester, carbon fiber or metal fiber fabric, mesh, or nonwoven material.

37. The photovoltaic device/architectural membrane system of any of paragraphs 33 through 36, wherein the fluoropolymer cover layer is an ethylene tetrafluoroethylene copolymer layer (ETFE) or a fluorinated ethylene propylene copolymer (FEP).

38. The photovoltaic device/architectural membrane system of any of paragraphs 33 through 38, wherein the bondable layer is a PFA, PVDF, THV, ETFE or an FEP.

39. The photovoltaic device/architectural membrane system of any of paragraphs 33 through 38, wherein either the bondable layer is surface treated.

40. The photovoltaic device/architectural membrane system of any of paragraphs 33 through 39, further including an encapsulant disposed about the photovoltaic device.

41. The photovoltaic device/architectural membrane system of paragraph 40, wherein the encapsulant is an olefinic polymer or copolymer thereof.

42. The photovoltaic device/architectural membrane system of any of paragraphs 33 through 42, further including a back sheet attached to the photovoltaic device.

43. The photovoltaic device/architectural membrane system of any of paragraphs 33 through 42, wherein the layers are heat sealed.

44. A photovoltaic device/architectural membrane system comprising:
a first layer comprising a fluoropolymer encapsulated reinforcement layer;
a second layer comprising a fluoropolymer encapsulated reinforcement such that a first side provides an unencapsulated reinforcement surface and a second surface that is fluoropolymer encapsulated, such that the second surface is adjacent to the reinforcement layer;
third layer comprising bondable layer disposed about at least a portion of the perimeter of the unencapsulated reinforcement surface, such that the bondable layer extends beyond the perimeter of the unencapsulated reinforcement surface;
a photovoltaic device disposed on the second layer unencapsulated reinforcement surface;
a fourth layer comprising an adhesive layer disposed on at least a portion of the perimeter of the photovoltaic device;
a fifth layer comprising a fluoropolymer encapsulated reinforcement such that a first side provides an unencapsulated reinforcement surface and a second surface that is fluoropolymer encapsulated, such that the first surface is disposed about the perimeter of the photovoltaic device and the portions covered by the fourth layer.

45. The photovoltaic device/architectural membrane system of paragraph 44, wherein the third bondable layer can be heat sealed to the first layer, the fifth layer or both.

46. The photovoltaic device/architectural membrane system of either paragraph 44 or 45, wherein the third bondable layer is a PFA, PVDF, THV, ETFE or an FEP.

47. The photovoltaic device/architectural membrane system of any of paragraphs 44 through 46, further comprising an, optional adhesive layer, disposed on the portion of the unencapsulated reinforcement surface of the third layer not covered by the bondable layer.

48. The photovoltaic device/architectural membrane system of any of paragraphs 44 through 47, wherein the third layer is configured as a frame, as individual segments, or as strips.

49. The photovoltaic device/architectural membrane system of paragraph 48, wherein the frame, segments, or strips do not completely encompass the entire perimeter portion of the perimeter of the unencapsulated reinforcement surface of the second layer.

50. The photovoltaic device/architectural membrane system of any of paragraphs 44 through 49, wherein the fluoropolymer of the first, second or third fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

51. The photovoltaic device/architectural membrane system of any of paragraphs 44 through 50, wherein the reinforcement comprises a glass, polyaramid, polyester, carbon fiber or metal fiber fabric, mesh, or nonwoven material.

52. The photovoltaic device/architectural membrane system of any of paragraphs 44 through 51, wherein the bondable layer is a PFA, PVDF, THV, ETFE or an FEP.

53. The photovoltaic device/architectural membrane system of any of paragraphs 44 through 52, wherein either the bondable layer is surface treated.

54. The photovoltaic device/architectural membrane system of any of paragraphs 44 through 53, further including an encapsulant disposed about the photovoltaic device.

55. The photovoltaic device/architectural membrane system of paragraph 54, wherein the encapsulant is an olefinic polymer or copolymer thereof.

56. The photovoltaic device/architectural membrane system of any of paragraphs 44 through 55, further including a back sheet attached to the photovoltaic device.

57. The photovoltaic device/architectural membrane system of paragraph 56, wherein the adhesive is neoprene rubber, a two part epoxy, a silicone resin or a polyurethane.

58. The photovoltaic device/architectural membrane system of any of paragraphs 1 through 57 further comprising a segment of material adhered to the fluoropolymer encapsulated reinforcement in such a configuration so as to cover an upward facing portion of the system such that water, snow, ice, dirt or debris are distributed away from the photovoltaic device.

The invention will be further described with reference to the following non-limiting Examples. It will be apparent to those skilled in the art that many changes can be made in the embodiments described without departing from the scope of the present invention. Thus the scope of the present invention should not be limited to the embodiments described in this application, but only by embodiments described by the language of the claims and the equivalents of those embodiments. Unless otherwise indicated, all percentages are by weight.

EXAMPLES

Example 1

Fabric Frame Sample

FIG. 7 provides a basis for the following description.

A frame shape 70 is cut from one-sided PTFE coated fabric (unencapsulated reinforcement layer 40) (Saint-Gobain Raydel M26 OS).

GE Silicone II caulk adhesive (clear) 60 was applied around the inside perimeter of the frame 70 on the unencapsulated side 45. A flexible photovoltaic device 20 was hand pressed face down into adhesive 60. Adhesive 60 was cured. After curing was completed, the frame 70/photovoltaic device 20 combination was turned face up and a corner of hard plastic (e.g., Nylon) can be used to clean up excess adhesive 60 that may be disposed upon the face of photovoltaic 20.

A second piece of one-sided PTFE coated fabric (unencapsulated reinforcement layer 40) was cut to approximately the outer dimensions of frame 70. A thin layer of liquid silicone rubber 110 was applied to the central area of frame 70 and cured to provide backing layer 80. Layer 110 can help in keeping photovoltaic device 20 from slipping in completed pouch 85.

The edges of layer 40 (unencapsulated surface 45) were masked off with tape and layer 110 was applied. Layer 110 (Dow Corning 9252-500P) was drawn down over the entire glass side of the fabric (unencapsulated surface 45) and then cured for approximately 6 minutes at 325° F. Once cured, the masking tape was removed to afford backing layer 80.

Bonding layer 30, e.g., an FEP film, is tacked on the exposed unencapsulated reinforcement surface 45 of both pieces of fabric frame 70 and backing layer 80. For example, frame 70 was contacted with 10 mils of bonding layer 30, e.g., FEP. A 5 mil bonding layer 30, e.g., FEP film, was applied to backing layer 80 about the exposed unencapsulated reinforcement surface 45 and on the reverse side 'under' the exposed unencapsulated reinforcement surface 45 to fluoropolymer surface 50. (This was accomplished by wrapping the 5 mil film from one face to the other and tacked in place).

Frame 70 was placed on top of backing layer 80 and the two were sealed together via bonding layers 30 to form pouch 85. Sealing was done with a 3"×5" tacker set at 680° F. using 2.5 minute dwell for each application.

These first 5 steps were done in a factory and pouch 85 can be delivered ready to install to the site.

Pouch 85 was heat sealed directly to a fluoropolymer encapsulated reinforcement layer 15, e.g., SHEERFILL. A bonding layer can be situated between layer 15 and pouch 85, such as an FEP film, to enhance the bond between the pouch 85 and fluoropolymer encapsulated reinforcement layer 15. Heat sealing was done with a 3"×5" tacker set at 680° F. with a dwell time of 2.5 minutes each.

Although the present invention has been described with reference to preferred embodiments, persons skilled in the art will recognize that changes may be made in form and detail without departing from the spirit and scope of the invention. All references cited throughout the specification, including those in the background, are incorporated herein in their entirety. Those skilled in the art will recognize, or be able to ascertain, using no more than routine experimentation, many equivalents to specific embodiments of the invention described specifically herein. Such equivalents are intended to be encompassed in the scope of the following claims.

What is claimed is:

1. A photovoltaic device/architectural membrane system comprising:
    a fluoropolymer encapsulated reinforcement layer;
    a photovoltaic device in contact with the fluoropolymer encapsulated reinforcement;
    a fluoropolymer cover layer that is heat sealable that covers and extends beyond the perimeter of the photovoltaic device; and
    a bondable layer between the fluoropolymer cover layer and the fluoropolymer encapsulated reinforcement layer.

2. The photovoltaic device/architectural membrane system of clam 1, wherein the fluoropolymer of the fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

3. The photovoltaic device/architectural membrane system of claim 1, wherein the reinforcement comprises a glass, polyaramid, polyester, carbon fiber or metal fiber fabric, mesh, or nonwoven material.

4. The photovoltaic device/architectural membrane system of claim 1, wherein the fluoropolymer cover layer is an ethylene tetrafluoroethylene copolymer layer (ETFE), a fluorinated ethylene propylene copolymer (FEP), or a perfluoroalkoxy resin (PFA).

5. The photovoltaic device/architectural membrane system of claim 1, wherein the bondable layer is a PFA, PVDF, THV, ETFE or an FEP.

6. A photovoltaic device/architectural membrane system comprising:
    a fluoropolymer encapsulated reinforcement layer;
    a photovoltaic device in contact with the fluoropolymer encapsulated reinforcement;
    a fluoropolymer cover layer that is heat sealable, that holds the photovoltaic device and extends beyond the perimeter of the photovoltaic device and is bonded to the fluoropolymer encapsulated reinforcement.

7. The photovoltaic device/architectural membrane system of claim 6, wherein the fluoropolymer of the fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

8. The photovoltaic device/architectural membrane system of claim 6, wherein the reinforcement comprises a glass, polyaramid, polyester, carbon fiber or metal fiber fabric, mesh, or nonwoven material.

9. The photovoltaic device/architectural membrane system of claim 6, wherein the fluoropolymer cover layer is an ethylene tetrafluoroethylene copolymer layer (ETFE), a fluorinated ethylene propylene copolymer (FEP), or a perfluoroalkoxy resin (PFA).

10. A photovoltaic device/architectural membrane system comprising:
    a fluoropolymer encapsulated reinforcement layer;
    a photovoltaic device in contact with the fluoropolymer encapsulated reinforcement;
    a fluoropolymer cover layer that is heat sealable that covers and extends beyond the perimeter of the photovoltaic device and is disposed onto a second bonding layer;
    a first bonding layer disposed upon the fluoropolymer encapsulated layer;
    a spacer layer disposed upon the first bonding layer; and the second bonding layer disposed upon the separating layer, whereby the first bonding layer, spacer layer and second bonding layer are provided about the perimeter of the photovoltaic device.

11. The photovoltaic device/architectural membrane system of clam 10, wherein the fluoropolymer of the fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

12. The photovoltaic device/architectural membrane system of claim 11, wherein the reinforcement comprises a glass, polyaramid, polyester, carbon fiber or metal fiber fabric, mesh, or nonwoven material.

13. The photovoltaic device/architectural membrane system of claim 11, wherein the fluoropolymer cover layer is an ethylene tetrafluoroethylene copolymer layer (ETFE), a fluorinated ethylene propylene copolymer (FEP), or a perfluoroalkoxy resin (PFA).

14. A photovoltaic device/architectural membrane system comprising:
 a first fluoropolymer encapsulated reinforcement layer;
 a photovoltaic device, wherein a bottom surface of the photovoltaic device is located adjacent to the fluoropolymer encapsulated reinforcement;
 a fluoropolymer cover layer that is heat sealable that extends beyond the perimeter of the top surface of the photovoltaic device; and
 a bondable layer disposed upon the fluoropolymer cover layer covering at least about the perimeter portion of the fluoropolymer cover layer; and
 a fluoropolymer layer or a second fluoropolymer encapsulated reinforcement layer that covers at least the perimeter portion of the bondable layer.

15. The photovoltaic device/architectural membrane system of claim 14, further comprising a heat sealable layer that covers a least a portion of the bottom of the photovoltaic device.

16. The photovoltaic device/architectural membrane system of claim 14, wherein the fluoropolymer of the fluoropolymer layer or first or second fluoropolymer encapsulated reinforcement layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

17. The photovoltaic device/architectural membrane system of claim 14, wherein the reinforcement comprises a glass, polyaramid, polyester, carbon fiber or metal fiber fabric, mesh, or nonwoven material.

18. The photovoltaic device/architectural membrane system of claim 14, wherein the fluoropolymer cover layer is an ethylene tetrafluoroethylene copolymer layer (ETFE), a fluorinated ethylene propylene copolymer (FEP), or a perfluoroalkoxy resin (PFA).

19. The photovoltaic device/architectural membrane system of claim 14, wherein the bondable layer is a PFA, PVDF, THV, ETFE or an FEP.

20. The photovoltaic device/architectural membrane system of claim 14, further comprising a segment of material adhered to the fluoropolymer encapsulated reinforcement in such a configuration, wherein water, snow, ice, dirt or debris are distributed away from the photovoltaic device.

* * * * *